United States Patent
Wu et al.

(10) Patent No.: US 6,355,518 B1
(45) Date of Patent: Mar. 12, 2002

(54) METHOD FOR MAKING A DRAM CELL WITH DEEP-TRENCH CAPACITORS AND OVERLYING VERTICAL TRANSISTORS

(75) Inventors: Chao-chueh Wu, Hsin chu; Chia-shun Hsiao, Hsin-chu, both of (TW)

(73) Assignee: Promos Technologies, Inc., Hsin-Chu (TW)

( * ) Notice: Subject to any disclaimer, the term of this patent is extended or adjusted under 35 U.S.C. 154(b) by 0 days.

(21) Appl. No.: 09/655,084

(22) Filed: Sep. 5, 2000

(51) Int. Cl.⁷ ........................................... H01L 21/8242
(52) U.S. Cl. ..................... 438/246; 438/248; 438/243
(58) Field of Search ................................ 438/246, 248, 438/FOR 212; 257/304

(56) References Cited

U.S. PATENT DOCUMENTS

| | | | |
|---|---|---|---|
| 5,302,541 A | | 4/1994 | Akazawa ...................... 437/52 |
| 5,552,620 A | * | 9/1996 | Lu et al. |
| 5,744,386 A | | 4/1998 | Kenney ....................... 438/245 |
| 6,024,140 A | * | 3/1999 | Gruening et al. |
| 5,937,296 A | | 8/1999 | Arnold ........................ 438/270 |
| 6,235,560 B1 | * | 8/1999 | Ma et al. |
| 6,018,176 A | | 1/2000 | Lim ........................... 257/302 |
| 6,074,909 A | * | 6/2000 | Gruening |
| 6,294,423 B1 | * | 11/2000 | Malik et al. |

OTHER PUBLICATIONS

IBM Technical Disclosure Bulletin, Aug. 1990, vol. 33, issue # 3A, pp. 72–75.*

* cited by examiner

Primary Examiner—George Fourson
Assistant Examiner—Thanh Pham
(74) Attorney, Agent, or Firm—George O. Saile; Stephen B. Ackerman

(57) ABSTRACT

A method and structure are achieved for making an array of high-density memory cells for DRAMs. The high density is achieved by forming vertical cylindrical transistors aligned over deep-trench capacitors in a silicon substrate. The method consists of forming a field oxide around and extending inward over a portion of polysilicon trench capacitor electrodes. A gate isolation oxide and an array of word lines are formed aligned over the trench capacitor electrodes, and openings are etched in the word lines to the trench capacitor electrodes. Source contacts are implanted in the trench capacitor electrodes exposed in the openings. A gate oxide for the vertical transistors (FETs) is formed on the sidewalls in the openings, and a P doped polysilicon is formed in the openings for the FET channels. The vertical transistors are then completed by forming a drain implant in the FET channels, and a polysilicon layer is deposited and patterned to form an array of bit lines. The alignment of the vertical transistors over the trench capacitors significantly reduces the memory cell area and increases the memory cell density for future DRAM devices, while providing a cost-effective process.

20 Claims, 3 Drawing Sheets

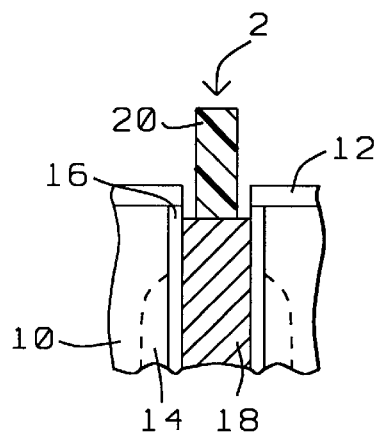
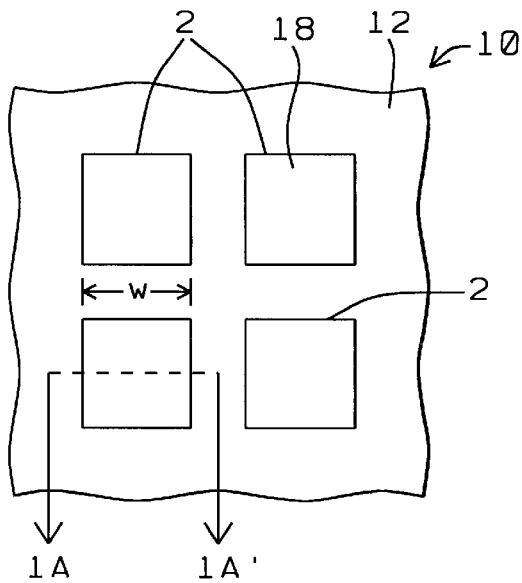
FIG. 1A          FIG. 1B
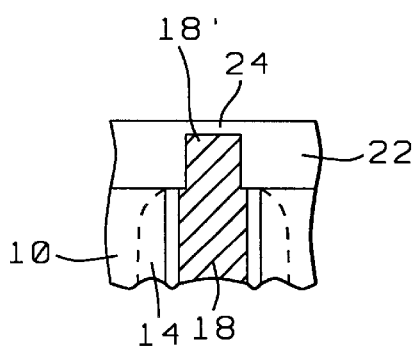
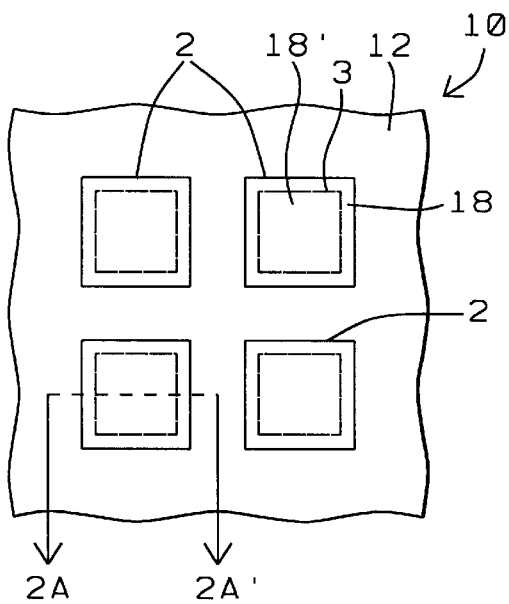
FIG. 2A          FIG. 2B

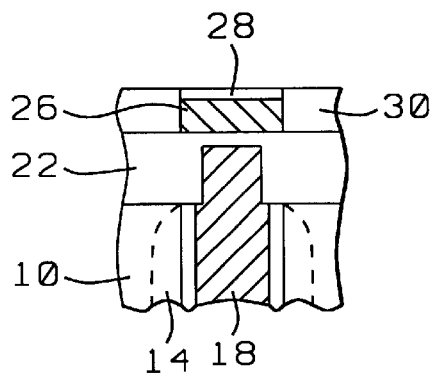
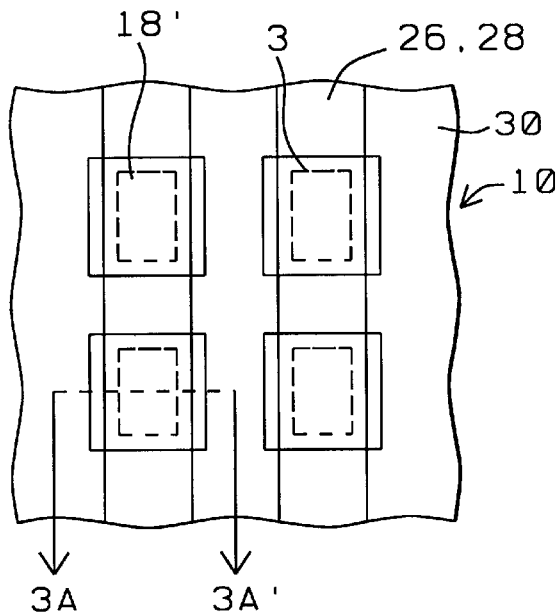
FIG. 3A  FIG. 3B
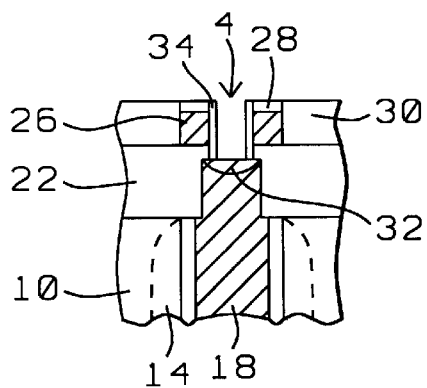
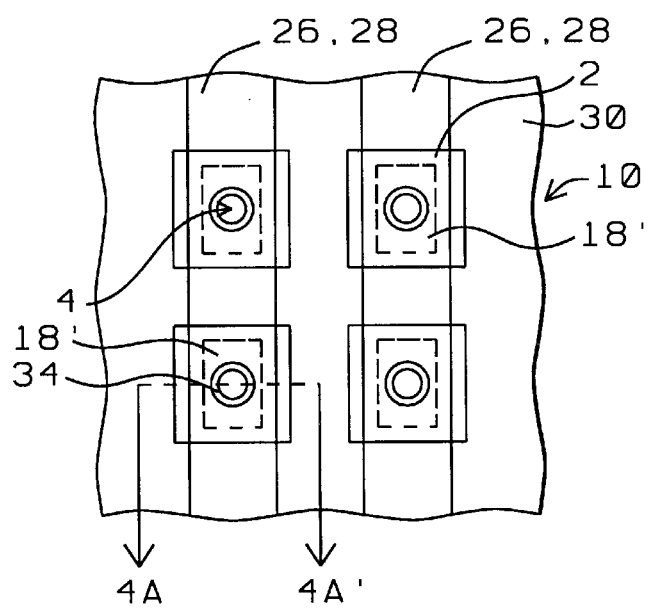
FIG. 4A  FIG. 4B

METHOD FOR MAKING A DRAM CELL WITH DEEP-TRENCH CAPACITORS AND OVERLYING VERTICAL TRANSISTORS

BACKGROUND OF THE INVENTION (1) Field of the Invention

This invention relates to an integrated circuit semiconductor device, and more particularly to a method for making deep-trench capacitors with overlying vertical cylindrical transistors (FET) for dynamic random access memory (DRAM) devices to form a very dense array of memory cells.

(2) Description of the Prior Art

Dynamic random access memory (DRAM) circuits are used in the electronics industry for storing information as binary data. The DRAM circuit formed on chips diced from semiconductor substrates consists of an array of memory cells, and includes peripheral circuits for randomly accessing the memory cells for storing and retrieving the digital information. The individual DRAM cell is composed of a single FET, commonly referred to as a pass transistor, and a single charge storage capacitor. The storage capacitor is usually formed in the semiconductor substrate as a trench capacitor, or alternatively, formed as a stacked capacitor over the FET and within the cell area.

In recent years the cell density has increased dramatically on the DRAM chip because of improvements in the semiconductor technologies, such as high-resolution photolithography and directional plasma etching. In future DRAM technology the number of memory cells on a DRAM chip, each storing a bit of information, is expected to exceed a gigabit in the next several years. As this cell density increases on the chip it is necessary to reduce the area of each cell to maintain a reasonable chip size and to improve the circuit performance.

Unfortunately, as the cell size decreases, it is necessary to reduce the storage capacitor size to restrict the capacitor to within a cell area. This results in decreased charge stored on the capacitor that makes it more difficult to detect during the read cycle because of the lower signal-to-noise ratio at the read sense amplifiers. These volatile storage cells also require more frequent refresh cycles to maintain sufficient charge on the capacitor. Therefore, there is a strong need in the electronics industry to increase the capacitance of the storage capacitor while reducing the cell area.

Of the two approaches, the stacked capacitor has received considerable interest in recent years because of the variety of ways that the capacitor electrodes can be formed in the vertical (third) dimension over the FET and within the cell area to increase capacitance while reducing the cell area. However, the rough topography on the stacked capacitor requires an additional planarizing step to planarize the substrate surface in order to make more reliable submicrometer feature size structures, and the planarizing is a costly process that can also degrade product yield.

Alternatively, the DRAM cells can be made using deep-trench capacitors. In this approach the FET devices are formed adjacent to the trench capacitors and this limits reduction in cell area size. However, when the deep trench is formed in the substrate, the top surface of the substrate remains relatively planar and is available for forming the electrical interconnections having submicrometer feature sizes.

Several methods of making DRAMs with deep-trench capacitors have been reported. For example, Arnold, U.S. Pat. No. 5,937,296, forms a vertical transistor where the gate electrode is formed in the upper portion of the trench and source/drains are formed in the substrate. U.S. Pat. No. 5,302,541 to Akazawa shows a vertical transistor over a trench capacitor in which the source/drains are formed in a second conductive type material in the trench by out-diffusing from doped insulating oxide layers. In U.S. Pat. No. 5,744,386 to Kenney a vertical transistor is formed in the trench with an epitaxy, a gate oxide and gate electrodes formed in the trench. Lim, U.S. Pat. No. 6,018,176, forms a vertical transistor on a silicon-on-insulator substrate with a stacked capacitor over the transistor. p However, as the number of memory cells on a DRAM device continues to increase, there is still a strong need in the semiconductor industry to reduce the memory cell area while maintaining sufficient capacitance while providing a low-cost manufacturing process.

SUMMARY OF THE INVENTION

A principal object of this invention is to provide a very dense array of memory cells on a DRAM chip by forming a deep-trench capacitor with a vertical cylindrical transistor aligned over the capacitor, while providing a cost-effective process.

It is another object of this invention to form the vertical cylindrical transistor by forming the FET channel in an opening in the word line and aligned over the deep-trench capacitor.

A further object of this invention is to form an array of bit lines that are orthogonal to the word lines and that are aligned over the openings that have the FET channels.

In accordance with the objectives of the present invention, a method and structure are described for making an array of DRAM cells having deep-trench capacitors and vertical field effect transistors aligned over the deep-trench capacitors to decrease the cell area and dramatically increase DRAM cell density.

The method for making this array of DRAM cells with vertical FETs over capacitors is now briefly described. The method consists of providing a semiconductor substrate, preferably a P⁻ doped single-crystal silicon substrate. Conventional deep-trench capacitors are formed in the substrate. The deep-trench capacitors are formed by using a patterned CVD silicon oxide/silicon nitride hard mask and anisotropic plasma etching to etch deep trenches in the silicon substrate. A thin dielectric layer is formed in the deep trenches to form a capacitor interelectrode dielectric layer. Then the trenches are filled with a first poly-silicon to form the capacitor electrodes and that also serve as the node contacts for the capacitors. Next a shallow trench isolation (STI) is formed to surround and electrically isolate the array of deep trenches. The STI also forms other active device areas, such as the peripheral device areas on the DRAM chip. The STI is formed by first removing the CVD $SiO_2$ portion of the hard mask. Then a shallow-trench photoresist mask and plasma etching are used to pattern the $Si_3N_4$ portion of the hard mask and to etch shallow trenches in the substrate. The shallow trenches are formed to extend partly inward over the edge of the deep-trench capacitors and to leave active device areas over the first polysilicon deep-trench capacitors. The STI is completed by depositing an insulating layer and polishing back. A gate isolation oxide remains after chemical-mechanical polishing (CMP) on the surface of the first polysilicon layer in the deep-trench capacitors. Next, an N doped second polysilicon layer having a cap insulating layer is deposited and patterned to form word lines that extend over the deep-trench capacitors. An insulating layer is deposited over the word lines and polished back to expose the cap insulating layer on the word lines and to provide a planar surface. One important feature of this invention is to etch an array of openings in the cap insulating layer, in the polysilicon word lines, and in the gate isolation oxide. The openings are aligned over the first polysilicon (capacitor electrode) in the deep-trench capacitors. The source contacts for the vertical transistors are formed in the first polysilicon layer exposed in the openings by ion implantation. A gate oxide is formed on the sidewalls of the polysilicon word lines in the openings, followed by a bottom oxide etch using a directional plasma etch. Then a P doped third polysilicon layer is deposited sufficiently thick to fill the openings, and is polished back to the insulating layer to form FET channel cylinders. The drain contacts for the vertical transistors are formed in the top surface of the P doped third polysilicon layer exposed in the openings by ion implanting an N type dopant. An N doped fourth polysilicon layer is deposited and patterned to form an array of bit lines, that are orthogonal to the word lines, over the openings and electrically contacting the drain contact areas to complete the high-density array of DRAM cells. The fourth polysilicon layer may include an upper metal silicide layer to reduce electrical resistance and to improve circuit performance.

BRIEF DESCRIPTION OF THE DRAWINGS

The objects and advantages of this invention are best understood with reference to the attached drawings in the figures and the embodiment that follows.

FIGS. 1A through 6A show schematic cross-sectional views for the sequence of process steps for making DRAM cells having vertical cylindrical transistors (FETs) aligned over the DRAM storage capacitors. One of the multitude of DRAM cells in shown in the drawings.

FIGS. 1B through 6B show schematic top views of four adjacent DRAM cells corresponding to the sequence of cross-sectional views for making the DRAM cells with vertical transistors of FIGS. 1A–6A.

DESCRIPTION OF THE PREFERRED EMBODIMENT

Figure 5A:
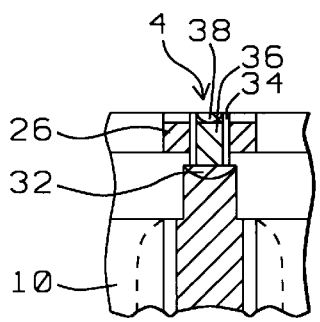

The method is now described in detail for making DRAMs with vertical cylindrical transistors aligned over the deep-trench capacitors for increasing cell density. Although the method is described for making only DRAM devices with deep-trench capacitors and vertical N channel transistors, it should be understood that by including additional processing steps, both conventional N channel FETs and P channel FETs can also be formed, such as required for making CMOS circuits for the peripheral circuits on the DRAM device.

Referring to FIG. 1A, the method for making these deep-trench capacitors having N channel vertical FETs begins by providing a semiconductor substrate 10. The substrate is preferably a P$^-$ doped single-crystal silicon having a <100> crystallographic orientation.

Next deep-trench capacitors are formed in the substrate 10 as is commonly practiced in the industry. Briefly, conventional photolithographic techniques and anisotropic plasma etching are used to form an array of openings in a hard mask on the substrate 10, which are then used to etch deep trenches 2 in the substrate 10. Typically the hard-mask layer consists of an insulating layer, such a silicon oxide (not shown), and a pad silicon nitride ($Si_3N_4$) layer 12. The layer 12 is deposited by chemical vapor deposition (CVD) using a reactant gas such as dichlorosilane ($SiCl_2H_2$) and ammonia ($NH_3$), and is deposited to a preferred thickness of between about 1500 and 2000 Angstroms. The array of deep trenches 2 are then etched in the silicon substrate 10 using high-density plasma (HDP) etching or reactive ion etching (RIE), and preferably using a fluorine-based etchant gas such as $NF_3$ and HBr. The trenches are typically etched to a depth of about 7 to 8 micrometers (um) and typically have a width W of between about 0.2 and 0.3 um. Only a single trench and an upper portion of the trench are shown in FIG. 1A to simplify the drawing. The cross section in FIG. 1A is for the cross section through the region 1A–1A' in the top view of FIG. 1B, which shows the layout for four adjacent deep-trench openings 2 etched in the substrate 10. After etching the trenches 2 the silicon oxide portion of the hard mask is removed and the pad $Si_3N_4$ layer 12 is retained as a barrier layer to oxidation and as a polish-back etch mask.

Still referring to FIG. 1A, capacitor electrodes (first electrodes) 14 are formed in the silicon substrate 10 adjacent to the deep trenches 2 by diffusing a dopant, such as arsenic. Typically the capacitor electrodes 14 are doped to a concentration of between about $5.0 \times 10^{19}$ and $1.0 \times 10^{20}$ atoms/$cm^3$. Next a thin dielectric layer 16 is formed on the exposed silicon surfaces in the deep trenches 2 to form the interelectrode dielectric layer 16. Typically the dielectric layer is formed by depositing a $Si_3N_4$ layer by LPCVD to a thickness of between about 40 and 50 Angstroms and the $Si_3N_4$ is thermally oxidized to form a silicon oxide/silicon nitride/silicon oxide (ONO) layer and to reduce pinholes in the $Si_3N_4$ dielectric layer 16. Then the trenches 2 are filled with a first polysilicon layer 18 to form the trench capacitor electrodes (second electrodes) that are also the node contacts 18 for the capacitors. Typically the first polysilicon layer 18 is deposited by CVD and is in-situ doped with an N type dopant, such as phosphorus, to a concentration of between about $5.0 \times 10^{19}$ and $1.0 \times 10^{20}$ atoms/$cm^3$. The polysilicon is polished back to the barrier layer 12 to form the polysilicon capacitor electrodes 18. For this invention the polysilicon 18 is further recessed, using plasma etching, to about 500 Angstroms below the surface of the silicon substrate 10. A gate isolation oxide is later formed in the recess to prevent the vertical transistor gate electrode from electrically shorting to the capacitor.

Still referring to FIG. 1A, shallow trench isolation regions are formed to surround and electrically isolate the array of deep trenches 2 and to form other active device areas. The shallow trench isolation is formed by using a photoresist mask 20 and plasma etching to pattern the $Si_3N_4$ layer 12 of the hard mask and to etch shallow trenches that extend partly inward over the edge of the deep-trench capacitor electrodes 18 leaving a polysilicon portion 18' over the deep trench capacitors. The portion of the photoresist mask 20 over the deep trench capacitors is shown in FIG. 1A. The shallow trenches are also etched to form active device areas elsewhere on the substrate.

Referring to FIG. 2A, after etching the shallow trenches to a depth of between about 3000 and 4000 Angstroms, a brief thermal oxidation is carried out to reduce surface damage of the silicon substrate 10 in the shallow trenches. A CVD $SiO_2$ 22 is deposited and polished back to form the shallow trench isolation (STI) 22. A portion of the CVD $SiO_2$ 22 remains over the polysilicon portion 18' to serve as a gate isolation oxide 24 to prevent the capacitor nodes from shorting to the gate electrodes of the vertical transistors. Alternatively, the CVD oxide 22 can be selectively etched back to the surface of the polysilicon portion 18' and an additional gate isolation oxide 24 can be deposited to a preferred thickness of between about 400 and 600 Angstroms, and more specifically to a thickness of about 500 Angstroms. FIG. 2B shows a top view of four adjacent memory cells, and the cross section through the region 2A–2A' of FIG. 2B is shown in FIG. 2A for one of the four adjacent memory cells. The dashed line 3 in FIG. 2B is the perimeter of the top portion of polysilicon portion 18' aligned to the capacitor opening 2.

Referring to FIG. 3A and more specifically to the method of the invention, an N doped second polysilicon layer 26 having a cap insulating layer 28 is deposited and patterned to form word lines 26 that extend over the deep-trench capacitor portions 18'. FIG. 3B shows a top view of four adjacent memory cells, and the cross section through the region 3A–3A' of FIG. 3B is shown in FIG. 3A for one of the four adjacent memory cells. The second polysilicon layer 26 is deposited by LPCVD using, for example, silane ($SiH_4$) as the reactant gas, and is in-situ doped or by ion implanting an N type dopant, such as phosphorus, to a final concentration of between about $1.0 \times 10^{19}$ and $5.0 \times 10^{19}$ atoms/$cm^3$. Second polysilicon layer 26 is deposited to a preferred thickness of between about 1800 and 2500 Angstroms, and more specifically to a thickness of about 2000 Angstroms. Second polysilicon layer 26 is patterned using conventional photolithographic techniques and anisotropic plasma etching to form the word lines 26. The cap insulating layer 28 is $Si_3N_4$ or $SiO_2$, deposited by CVD to a thickness of between about 300 and 800 Angstroms, and more specifically to a thickness of about 500 Angstroms. Next, an insulating layer 30 is deposited over the word lines 26. Layer 30 is $SiO_2$, or a doped $SiO_2$ such as borophosphosilicate glass (BPSG), and is deposited by CVD to a thickness at least greater than the combined thicknesses of layers 26 and 28. Layer 30 is chemically-mechanically polished back to the cap insulating layer 28 on the word lines 26 to provide a planar surface.

Referring to FIG. 4A, an array of openings 4 is etched in the cap insulating layer 28, in the polysilicon word lines 26, and in the gate isolation oxide 24 to the first polysilicon (capacitor electrode) 18' in the deep-trench capacitors. The openings 4 are etched for the channel cylinders for vertical transistors (FETs). The word lines 26 typically have a width of about 0.3 to 0.5 micrometers (um), and the openings 4 have a preferred diameter of between about 0.25 and 0.3 um. The openings 4 are aligned over the first polysilicon portion 18', as shown in the top view of FIG. 4B. The cross section in FIG. 4A is through the region 4A–4A' in FIG. 4B. The openings 4 are etched using photolithographic techniques and anisotropic plasma etching. The plasma etching is carried out in a high-density plasma etcher. The insulating cap layer 28 is etched selectively to the second polysilicon layer 26 (word lines) using an etchant gas mixture such as $CHF_3$, $O_3$, and $CF_4$. The second polysilicon 26 is etched selectively to the gate isolation layer 24 using an etchant gas mixture such as $CHF_3$ and $NF_3$. And the gate isolation oxide 24 is etched selectively to the polysilicon 18' using an etchant gas mixture such as $CHF_3$, $O_3$, and $CF_4$.

Still referring to FIG. 4A, an ion implantation is carried out to form the source contacts 32 in the first polysilicon portion 18' in the openings 4 for the vertical transistors. The source contacts 32 are formed by implanting a dopant such as phosphorus. The contacts 32 are doped to form an $N^-$ doped source to achieve a final concentration of between about $1.0 \times 10^{14}$ and $5.0 \times 10^{14}$ atoms/$cm^3$. Next, a gate oxide 34 is formed on the sidewalls of the polysilicon word lines 26 in the openings 4, as shown in FIG. 4A. The gate oxide 34 is formed by a thermal oxidation in oxygen, and is grown to a thickness of between about 60 and 80 Angstroms. The gate oxide that is unintentionally formed on the surface of polysilicon 18' is then removed selectively using a high-density plasma etch at low pressure. The gate oxide 34 is also depicted in the top view of FIG. 4B.

Figure 5B:
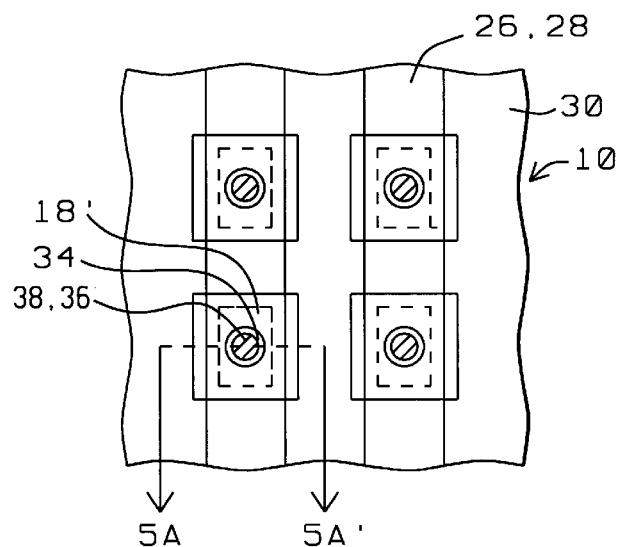

Referring to FIG. 5A, a boron-doped third polysilicon layer 36 is deposited sufficiently thick to fill the openings 4. Layer 36 is deposited using LPCVD and is in-situ doped to achieve a final boron concentration of between about $1.0 \times 10^{12}$ and $5.0 \times 10^{12}$ atoms/$cm^3$. Third polysilicon layer 36 is then polished back to the insulating layer 30 to form FET channel cylinders 36 in the openings 4. Next the drain contacts 38 for the vertical transistors are formed in the top surface of the P doped channel cylinders 36. The drain contacts are formed by ion implanting an N type dopant, such as arsenic ions ($As^{75}$), to achieve an $N^-$ final dopant concentration of between about $1.0 \times 10^{14}$ and $5.0 \times 10^{14}$ atoms/$cm^3$. The cross-sectional view in FIG. 5A is shown for the region 5A–5A' in the top view of FIG. 5B, and includes the channel cylinder 36 with the drain contact 38.

Figure 6A:
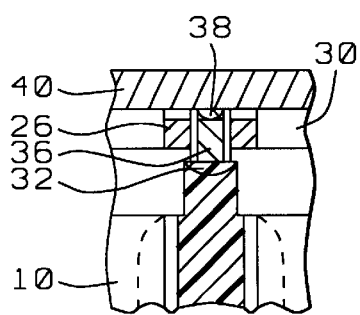
Figure 6B:
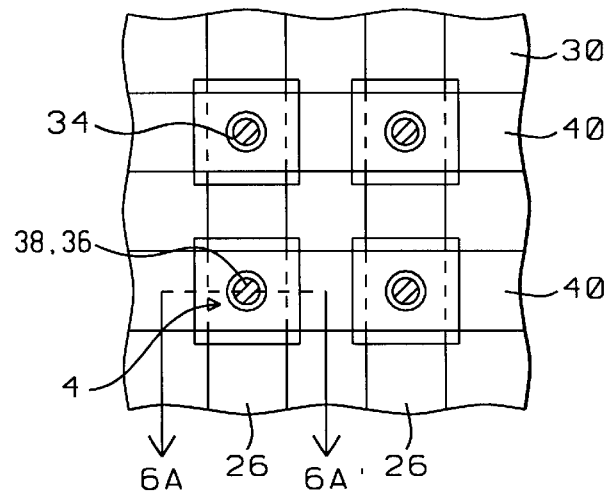

Referring to FIG. 6A, a fourth polysilicon layer 40 is deposited, for example, by LPCVD using a reactant gas such as $SiH_4$, and is doped with phosphorus by ion implantation, or in-situ doped during deposition using, for example, phosphine. The fourth polysilicon layer 40 is deposited to a thickness of between about 2000 and 3000 Angstroms, and is doped to a final concentration of between about $5.0 \times 10^{19}$ and $1.0 \times 10^{20}$ atoms/$cm^3$. Alternatively, the fourth polysilicon layer 40 may include an upper metal silicide layer (not shown), forming a polycide layer, to reduce electrical resistance and to improve circuit performance. For example, a tungsten silicide ($WSi_x$) layer can be deposited by CVD using tungsten hexafluoride ($WF_6$) and $SiH_4$ as the reactant gases, and typically would be deposited to a thickness of about 500 to 800 Angstroms. Layer 40 is then patterned to form an array of bit lines 40. Conventional photolithographic techniques and anisotropic plasma etching are used to etch layer 40 to form the bit lines. Preferably the etching is carried out in a HDP etcher or reactive ion etcher using a chlorine-based etchant gas such as HCl, Cl, and $NF_3$ for etching the $WSi_x$, and HCl and $Cl_2$ for etching the polysilicon. The bit lines 40 are formed orthogonal to the word lines 26, as depicted in the top view of FIG. 6B. The bit lines 40 are also formed aligned over the openings 4 and electrically contacting the drain contact areas 38 to complete the vertical transistors and the high-density array of DRAM cells.

While the invention has been particularly shown and described with reference to the preferred embodiment thereof, it will be understood by those skilled in the art that various changes in form and details may be made without departing from the spirit and scope of the invention.

What is claimed is:

1. A method for manufacturing an array of DRAM cells having vertical transistors aligned over deep-trench capacitors formed in deep trenches in a semiconductor substrate comprising the steps of:

forming said deep-trench capacitors having capacitor electrodes formed from a doped first polysilicon layer, doped with a first type dopant, in said substrate;

forming a shallow trench isolation extending inward over the edge of said deep-trench capacitors while providing active device areas over said deep-trench capacitors;

forming word lines from a doped second polysilicon layer, doped with a first type dopant, coplanar with an insulating layer, said word lines having an upper cap insulating layer and a lower gate isolation oxide to isolate said capacitor electrodes from said word lines;

forming an array of openings in said cap insulating layer, in said word lines, and in said lower gate isolation oxide to said capacitor electrodes;

forming source contacts in said capacitor electrodes in said openings;

forming a gate oxide on sidewalls of said word lines in said openings;

filling said openings with a doped third polysilicon layer, doped with a second type dopant, to form FET channels;

forming drain contacts in top surface of said third polysilicon layer exposed in said openings.

2. The method of claim 1 further comprising forming an array of bit lines from a doped fourth polysilicon layer, doped with a first type dopant, said bit lines orthogonal to said word lines over said openings to complete said array of DRAM cells.

3. The method of claim 1, wherein said first type dopant is N type and said second type dopant is P type.

4. The method of claim 1, wherein said gate isolation oxide is formed to a thickness of between about 400 and 600 Angstroms.

5. The method of claim 1, wherein said cap insulating layer is deposited to a thickness of between about 300 and 800 Angstroms.

6. The method of claim 1, wherein said cap insulating layer is silicon nitride or silicon oxide.

7. The method of claim 1, wherein said insulating layer is a borophosphosilicate glass (BPSG) deposited to a thickness that is essentially equal to the combined thicknesses of said second polysilicon layer and said cap insulating layer.

8. The method of claim 1, wherein said gate oxide is silicon oxide and is formed to a thickness of between about 60 and 80 Angstroms.

9. The method of claim 1, on said fourth polysilicon layer further including forming a metal silicide top surface to reduce resistivity.

10. A method for manufacturing an array of DRAM cells having vertical transistors aligned over deep-trench capacitors formed in deep trenches in a semiconductor substrate comprising the steps of:

forming said deep-trench capacitors in part from an N doped first polysilicon layer in said substrate;

forming a shallow trench isolation extending inward over the edge of said deep-trench capacitors while providing active device areas over said deep-trench capacitors;

forming a gate isolation oxide on surface of said deep-trench capacitors;

depositing an N doped second polysilicon layer and a cap insulating layer, and patterning to form word lines over said deep-trench capacitors;

depositing an insulating layer over said word lines and polishing back to expose said cap insulating layer on said word lines and to form a planar surface;

forming an array of openings in said cap insulating layer, in said word lines, and in said gate lower isolation oxide to said first polysilicon in said deep-trench capacitors;

forming source contacts in said first polysilicon layer exposed in said openings;

forming a gate oxide on sidewalls of said word lines in said openings;

depositing a P doped third polysilicon layer sufficiently thick to fill said openings, and polishing back to said insulating layer to form FET channels;

forming drain contacts in top surface of said third polysilicon layer exposed in said openings;

depositing an N doped fourth polysilicon layer and patterning to form an array of bit lines orthogonal to said word lines over said openings to complete said array of DRAM cells.

11. The method of claim 10, wherein said gate isolation oxide is formed to a thickness of between about 400 and 600 Angstroms.

12. The method of claim 10, wherein said cap insulating layer is silicon nitride deposited to a thickness of between about 300 and 800 Angstroms.

13. The method of claim 10, wherein said insulating layer is a borophosphosilicate glass (BPSG) deposited to a thickness that is at least greater than the combined thicknesses of said second polysilicon layer and said cap insulating layer.

14. The method of claim 10, wherein said source contacts are formed by implanting arsenic ions to achieve a final concentration of between about $1.0 \times 10^{14}$ and $5.0 \times 10^{14}$ atoms/cm$^3$.

15. The method of claim 10, wherein said gate oxide is silicon oxide and is formed to a thickness of between about 60 and 80 Angstroms.

16. The method of claim 10, on said fourth polysilicon layer further including forming a metal silicide top surface to reduce resistivity.

17. An array of DRAM cells having vertical transistors aligned over deep-trench capacitors formed in deep trenches in a semiconductor substrate comprised of:

said deep-trench capacitors having capacitor electrodes composed of an N doped first polysilicon in said substrate;

a shallow trench isolation extending inward over the edge of said capacitor electrodes and that provides active device areas over said capacitor electrodes;

word lines composed of an N doped second polysilicon, said word lines coplanar with an insulating layer, said word lines having an upper cap insulating layer and a lower gate isolation oxide to isolate said capacitor electrodes from said word lines;

said cap insulating layer, said word lines, and said lower gate isolation oxide having an array of openings to said capacitor electrodes;

source contacts in said capacitor electrodes in said openings;

a gate oxide on sidewalls of said word lines in said openings;

FET channels composed of a P doped third polysilicon in said openings;

drain contacts in top surface of said FET channels;

an array of bit lines composed of an N doped fourth polysilicon layer, said bit lines orthogonal to said word lines over said openings.

18. The structure of claim 17, wherein said word lines have a width of between about 0.3 and 0.5 micrometers.

19. The structure of claim 17, wherein said gate isolation oxide has a thickness of between about 300 and 800 Angstroms.

20. The structure of claim 17, wherein each opening in said array of openings has a diameter of between about 0.25 and 0.3 micrometers.

* * * * *